(12) United States Patent
Yamakawa et al.

(10) Patent No.: US 6,351,006 B1
(45) Date of Patent: Feb. 26, 2002

(54) FERROELECTRIC CAPACITOR WITH MEANS TO PREVENT DETERIORATION

(75) Inventors: Koji Yamakawa, Kawasaki; Osamu Arisumi; Katsuhiko Hieda, both of Yokohama; Tsunetoshi Arikado, Tokyo; Hideyuki Kanai, Kawasaki, all of (JP)

(73) Assignee: Kabushiki Kaisha Toshiba, Kawaski (JP)

( * ) Notice: Subject to any disclaimer, the term of this patent is extended or adjusted under 35 U.S.C. 154(b) by 0 days.

(21) Appl. No.: 09/436,635

(22) Filed: Nov. 9, 1999

(30) Foreign Application Priority Data

Nov. 10, 1998 (JP) ............................................. 10-319160
Aug. 31, 1999 (JP) ............................................. 11-246581

(51) Int. Cl.$^7$ ............................................. H01C 29/94
(52) U.S. Cl. .................. 257/310; 257/306; 257/309; 257/295
(58) Field of Search ................................ 257/306, 309, 257/310, 295

(56) References Cited

U.S. PATENT DOCUMENTS

| | | | | |
|---|---|---|---|---|
| 5,440,173 A | * | 8/1995 | Evans, Jr. et al. | 257/751 |
| 5,470,668 A | * | 11/1995 | Wu et al. | 428/688 |
| 5,479,317 A | * | 12/1995 | Ramesh | 361/321.5 |
| 5,838,035 A | * | 11/1998 | Ramesh | 257/295 |
| 5,990,507 A | * | 11/1999 | Mochizuki et al. | 257/295 |
| 6,015,990 A | * | 1/2000 | Hieda et al. | 257/310 |
| 6,194,228 B1 | * | 2/2001 | Fujiki et al. | 438/3 |
| 6,218,233 B1 | * | 4/2001 | Takemura | 438/240 |

FOREIGN PATENT DOCUMENTS

| | | |
|---|---|---|
| JP | 8-335672 | 12/1996 |
| JP | 9-289297 | 11/1997 |
| JP | 10-12830 | 1/1998 |
| JP | 11-195768 | 7/1999 |

OTHER PUBLICATIONS

English abstract of Japanese Patent Application No. 10–12830.
English abstract of Japanese Patent Application No. 9–289297.
English abstract of Japanese Patent Application No. 8–335672.
English abstract of Japanese Patent Application No. 11–195768.
Cross, J.S. et al., "Characterization of PZT Capacitors With SrRuO$_3$ Electrodes", Integrated Ferroelectrics, vol. 21, pp. 263–271 (1998).

* cited by examiner

Primary Examiner—Steven Loke
Assistant Examiner—Douglas W. Owens
(74) Attorney, Agent, or Firm—Finnegan, Henderson, Farabow, Garrett, & Dunner, L.L.P.

(57) ABSTRACT

A semiconductor device comprises a semiconductor substrate and a capacitor provided above the semiconductor substrate and having an upper electrode, a lower electrode, and a dielectric film provided between the upper electrode and the lower electrode. At least one of the electrodes comprises an SrRuO$_3$ film provided near the dielectric film and a conductive film made of conductive material other than SrRuO$_3$ and provided far from the dielectric film.

12 Claims, 5 Drawing Sheets

FERROELECTRIC CAPACITOR WITH MEANS TO PREVENT DETERIORATION

BACKGROUND OF THE INVENTION

The present invention relates to a semiconductor device and a method of manufacturing the same, and more particularly to capacitors for use in semiconductor devices.

Memories in which a ferroelectric film is used as the dielectric film for capacitors (e.g., ferroelectric random access memories) are advantageous in some respects. First, they are nonvolatile memories. Second, data can be written into them and erased from them at high speed. Further, data can be rewritten in them a large number of times.

The ferroelectric film used in such a memory is a $Pb(Zr_xTi_{1-x})O_3$ film (PZT film) or the like. The PZT film is sandwiched between upper electrodes, on the one hand, and lower electrodes, on the other, whereby ferroelectric capacitors are provided. The electrodes are usually made of a noble metal (precious metal), such as Pt, Ir, or Ru. Electrodes are known, which are made of an electrically conductive oxide such as $IrO_2$ or $RuO_2$ to have improved fatigue characteristic (i.e., resistance to write/read cycles). Electrically conductive oxide, such as $IrO_2$ or $RuO_2$, has high resistivety. Hence, it is proposed that a conductive oxide film and a noble metal film (e.g., Pt film) be laminated to form an electrode.

Conventional electrodes of the structures described above cannot be said to posses the characteristics that the electrodes of ferroelectric capacitors should have. The problems with the conventional upper and lower electrodes will be described below.

First, the problems with the upper electrode will be described.

Generally, a ferroelectric capacitor is manufactured by the following method.

First, a CMOS structure is formed on an Si substrate. Then an insulating film, such as Si oxide film, is formed. Thereafter, a Pt/PZT/Pt/Ti composite layer is formed on the insulating film. In the process of forming the Pt/PZT/Pt/Ti composite layer, the Pt film and Ti film are formed by means of sputtering, and the PZT film is formed by sputtering or sol-gel method.

The Pt/PZT/Pt/Ti composite layer is then patterned by means of dry etching. CVD process is performed, forming an insulating film made of, for example, silicon oxide, thereby covering the composite layer patterned. RIE process is carried out, forming via holes. Sputtering is then effected, forming a wiring layer. Further, annealing is performed in a forming-gas atmosphere, thereby eliminating process damages to the transistor.

Of the various processes mentioned above, the capacitor are greatly influenced by reducing gas in the dry etching and the forming of the insulating film. When the PZT film is exposed to a reducing atmosphere, the perovskite structure will release oxygen. This is because the structure needs to remain in thermal equilibrium or the reducing atmosphere contains active hydrogen. The oxygen vacancy in the perovskite structure decreases the polarization value and changes the electrical conductivity. Consequently, the capacitor will have insufficient ferroelectricity. The polarization-retaining property, imprint property and the like of the capacitor are insufficient, too, perhaps because of the polarization caused by the space charge generated due to the oxygen vacancy.

The imprint property results in a hysteresis shift of the capacitor when writing is performed in one direction. For example, writing is performed in one direction and keeping the written state for a long period, thereafter writing is performed in opposite direction. In this case, the polarization-retaining property of the capacitor in the opposite direction is much deteriorated.

If the upper electrode of the capacitor is made of a noble metal such as Pt, it will work as a catalyst in a reducing atmosphere, generating active hydrogen. The active hydrogen reduces the PZT at the interface between the PZT film and the Pt electrode. Therefore, the characteristics of the capacitor change. If the lower electrode of the capacitor is made of Pt, the PZT/Pt interface is heated to a high temperature (600° C. or more) at the time of crystallizing the PZT. Ti used to a layer that bonds the lower electrode to the underlayer and Pb diffuse into the grain boundary of Pt and forms an oxide. Thereafter, the catalytic action of Pt is suppressed. Process damage can therefore be more suppressed at the lower electrode side than at the upper electrode side.

The upper electrode may be made of an electrically conductive oxide such as $IrO_2$ or $RuO_2$. Alternatively, the upper electrode may be made of a layer of such an electrically conductive oxide and a Pt layer provided on the oxide layer. In either case, not only the fatigue characteristic may be improved, but also the process damage developing in the reducing atmosphere may be suppressed. However, the electrically conductive oxide, i.e., $IrO_2$ or $RuO_2$, may be reduced. If the oxide is reduced, Ir or Ru will perform catalytic action, ultimately changing the characteristics of the capacitor as described above.

Now, the problems with the lower electrode will be described.

In most ferroelectric memory elements, the capacitors are provided in regions other than the transistor regions. Hence, the ferroelectric memory elements can hardly be arranged in high density. To enhance the integration density of the ferroelectric memory elements, the memory needs to have so-called "COP (Capacitor-On-Plug) structure," in which capacitor is provided directly on the contact plug. The COP structure is disadvantageous in that the material of the plug, either W or Si, reacts with PZT. An oxide of W or Si can be easily formed. The oxide, if formed, increases the contact resistance and causes morphological deterioration. To prevent this, it is necessary to form a barrier layer of TiN, TiAlN, TiSiN, TaN, TaSiN or the like on the plug made of W or Si.

If a barrier layer is formed, its elements may diffuse into the PZT film. Even if an electrically conductive oxide, such as $IrO_2$ or $RuO_2$, is formed on the barrier layer, the oxide can hardly inhibit the elements from diffusing into the PZT film. Furthermore, Ir or Ru in the electrically conductive oxide may diffuse into the PZT film to react with the elements of the PZT film. If Ir or Ru diffuses into the grain boundary in the PZT film, an electrically conductive oxide will be formed at the grain boundary. The oxide increases the leakage current that flows through the PZT film.

Thus, the diffusion of an element from the material of the lower electrode into the PZT film will be a great problem with the lower electrode.

As indicated above, a capacitor having a dielectric film (PZT film or the like) made of an oxide will be useful in semiconductor memories. However, the neither the upper electrode nor lower electrode of the conventional capacitor can be said to have optimum characteristic. The upper and lower electrodes of the conventional capacitor therefore change or deteriorate the characteristics of the capacitor.

BRIEF SUMMARY OF THE INVENTION

The object of the present invention is to provide a semiconductor device, which comprises capacitors, each having a dielectric film made of an oxide, and in which changes or deterioration of the characteristics of the capacitors can be inhibited.

According to this invention there is provided a semiconductor device which comprises a semiconductor substrate and a capacitor provided above the semiconductor substrate and having an upper electrode, a lower electrode, and a dielectric film made of oxide and provided between the upper and lower electrodes. At least one of the electrodes comprises an $SrRuO_3$ film provided near the dielectric film and a conductive film made of conductive material other than $SrRuO_3$ and provided far from the dielectric film.

If the upper electrode has the structure described above, the following advantages will be attained.

$SrRuO_3$ (SRO) is an electrically conductive oxide having perovskite structure and excels in resistance to reduction, unlike other electrically conductive oxides such as $IrO_2$ and $RuO_2$. Hence, the dielectric film made of oxide such as PZT will not be reduced even if a film of noble metal (precious metal) such as Pt, Ir, Ru or the like, which performs a strong catalytic action, is formed on an SRO film.

A capacitor was prepared, in which a PZT film was used as dielectric film made of an oxide, and in which a composite layer made of an SRO film and a Pt film laid on the SRO film was used as an upper electrode. When this capacitor was heated in a forming gas (i.e., nitrogen atmosphere containing 1 to 3% of hydrogen) at 450° C., the remanent polarization decreased from the initial value by 20 to 30% only. On the other hand, when the upper electrode was made of $IrO_2$ or $RuO_2$, and heated in the same conditions, the PZT film scarcely exhibited ferroelectricity.

In the present invention, an SRO film is interposed between the dielectric film made of oxide and a conductive film made of a prescribed conductive material. The resultant structure can acquire high resistance to reduction, which neither an $IrO_2$ film or an $RuO_2$ can acquire. Therefore, PZT would not be reduced in a reducing atmosphere. The oxygen vacancy will be decreased, and the characteristics of the capacitor will not change.

If the lower electrode has the structure described above, the following advantages will be attained.

$SrRuO_3$ (SRO) excels in barrier property in respect of metal elements and the like, unlike other electrically conductive oxides such as $IrO_2$ and $RuO_2$. In addition, the elements in SRO hardly diffuse. Hence, if a conductive film (which may function not only as a lower electrode but also a wire) is provided beneath the SRO film, the metal elements contained in the conductive film are prevented from diffusing into the dielectric film such as the PZT film. The characteristics of the capacitor are not deteriorated. The conductive film provided below the SRO film can therefore be made of various materials. It can be made not only of Pt, Ir, Ru and the like that have been hitherto used, but also of conductive materials such as TiN, W, TaN, silicide and the like.

Both the upper electrode and the lower electrode may have the structure described above. If this is the case, the capacitor will have an improved resistance to reduction and an enhanced barrier property in respect of metal elements.

In the semiconductor device, it is desirable that the $SrRuO_3$ film has a thickness greater than 2.5 nm and less than 40 nm.

In the semiconductor device, it is desirable that the dielectric film is made of a dielectric material represented by formula $ABO_3$, where A is at least one A-site element, B is at least one B-site element, and O is oxygen, or a dielectric material represented by formula $Bi_2A_{x-1}B_xO_{3x+3}$, where A is at least one A-site element, B is at least one B-site element, Bi is bismuth, and O is oxygen.

According to the invention there is provided a method of manufacturing a semiconductor device which comprises a semiconductor substrate, and a capacitor provided above the semiconductor substrate and having an upper electrode, a lower electrode, and a dielectric film made of oxide and provided between the upper and lower electrodes, and in which at least one of the electrodes comprises an $SrRuO_3$ film provided near the dielectric film and a conductive film made of conductive material other than $SrRuO_3$ and provided far from the dielectric film. The method comprises the steps of crystallizing an amorphous film of the material of the dielectric film, thereby forming the dielectric film, and crystallizing an amorphous film of the material of the $SrRuO_3$ film, thereby forming the $SrRuO_3$ film.

According to the invention there is provided another method of manufacturing a semiconductor device which comprises a semiconductor substrate, and a capacitor provided above the semiconductor substrate and having an upper electrode, a lower electrode, and a dielectric film made of oxide and provided between the upper and lower electrodes, and in which at least one of the electrodes comprises an $SrRuO_3$ film provided near the dielectric film and a conductive film made of conductive material other than $SrRuO_3$ and provided far from the dielectric film. The method comprises the step of forming a film between the dielectric film and the $SrRuO_3$ film, wherein the film contains at least one B-site element of a dielectric material represented by formula $ABO_3$, where A is at least one A-site element, B is at least one B-site element, and O is oxygen, or at least one B-site element of a dielectric material represented by formula $Bi_2A_{x-1}B_xO_{3x+3}$, where A is at least one A-site element, B is at least one B-site element, Bi is bismuth, and O is oxygen.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of this invention will be described, with reference to the accompanying drawings.

FIRST EMBODIMENT

Figure 1:
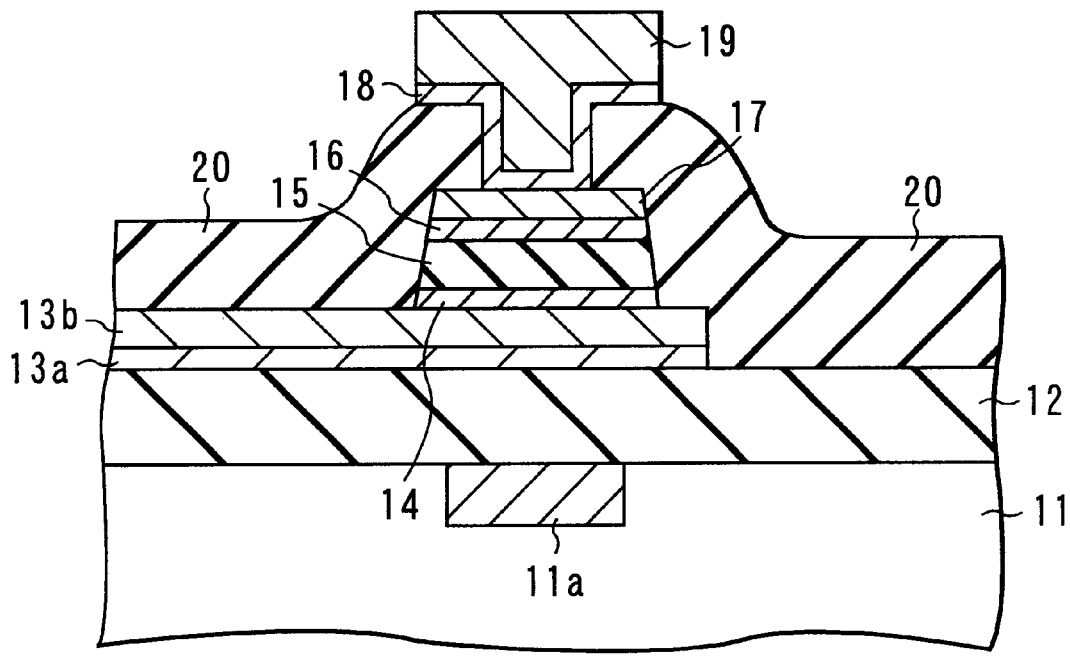
FIG. 1 is a sectional view showing mainly the capacitor region of a semiconductor device according to the first embodiment of the invention.

FIG. 1 is a sectional view showing the capacitor region of a semiconductor device, which is the first embodiment of the invention. The first embodiment is a ferroelectric memory, which comprises capacitors, each having, as dielectric film, a PZT film that is a perovskite oxide film.

The method of manufacturing the structure shown in FIG. 1 will be explained below.

First, a transistor (for example, an MIS transistor) 11a is formed in the surface of an Si substrate 11 by performing the ordinary method, thereby providing a CMOS structure. Then, a CVD process is performed, forming an interlayer insulating film 12, or an Si oxide film.

Next, a Ti adhesion film 13a is formed on the Si oxide film 12. A Pt film 13b is formed on the Ti adhesion film 13a by DC magnetron sputtering, immediately after forming the Ti film 13a so that the Ti film 13a may not be oxidized. The Pt film 13b has a thickness of 200 nm. Both the Ti film 13a and the Pt film 13b are formed at room temperature, whereby the Pt film 13b has a (111) face of a face-centered cubic lattice that extends parallel to the Si substrate 11. The Pt/Ti layer, thus formed, serves as a wiring layer (plate line) that constitutes a part of the capacitor.

Thereafter, an SRO film 14 about 10 to 20 nm thick is formed as follows. First, an amorphous SRO film is formed at room temperature by DC magnetron sputtering, to a thickness of about 10 to 20 nm. The target used in the sputtering has the same composition of the SRO film formed. More precisely, the amorphous SRO film is formed in an Ar atmosphere at a low power of about 200 to 400 W. If the amorphous SRO film is formed by reactive sputtering using oxygen, it will have a decreased uniformity in thickness and composition in the entire wafer. In view of this, the amorphous SRO film should better be formed in an atmosphere consisting of Ar only.

If an amorphous PZT film is formed and crystallized while the SRO film remains amorphous, mutual diffusion will occur at the interface between the SRO film and the PZT film, inevitably deteriorating the characteristics of the capacitor. To prevent the mutual diffusion, RTA (Rapid Thermal Annealing) is carried out in an oxygen atmosphere at 650° C. for 30 seconds, thereby crystallizing the amorphous SRO film provided on the Pt film. If the amorphous SRO film contains Ru in an amount 2 to 3% greater than the ordinary amount, the crystallization will be promoted.

Three SRO films, 100 nm thick, 200 nm thick and 20 nm thick, respectively, were crystallized by performing the same RTA at 650° C. for 30 seconds. These SRO films were subjected to X-ray diffraction. The 100-nm SRO film and the 200-nm SRO film had low SRO peaks and did not have a uniform cross-sectional structure. By contrast, the 20-nm SRO film had a high SRO peak and a uniform cross-sectional structure. Hence, an SRO film can excel in crystallinity if it is thin.

It suffices to form the SRO film 14 in at least a region where the capacitor will be formed. Nonetheless, the SRO film 14 may be formed also in a wiring region if both the SRO film and the Pt/Ti film are patterned at a time. If the Pt film in the wiring region is not sufficiently bonded to an interlayer insulating film of Si oxide, BPSG or PSG, an SRO film may be provided between the Pt film and the interlayer insulating film, thereby to firmly bonding the Pt film to the interlayer insulating film.

A PZT film 15 is formed on the SRO/Pt electrode thus formed, in the following manner. First, an amorphous PZT film is formed by means of RF magnetron sputtering. The target used in the RF magnetron sputtering is a ceramic PZT target that contains Pb in an amount about 10% larger than the ordinary value. This target has the composition of $Pb_{1.1}Zr_{0.4}Ti_{0.6}O_3$. The higher the density of the ceramic PZT target, the higher the sputtering rate. Further, the denser the ceramic PZT target, the more resistant it is to the environment such as water. Hence, the ceramic PZT target used in the embodiment is a ceramic sintered body having a theoretical density of 98%.

During the sputtering, the temperature of the substrate rises due to the plasma and the substrate is bombarded with sputtering particles. Therefore, Pb is evaporated or re-sputtered, and a loss of Pb is likely to occur in the PZT film. The ceramic PZT target contains Pb an excess amount in order to compensate such a loss of Pb. The other constituent elements of the ceramic PZT target, e.g., Zr and Ti, are taken into the PZT film in almost the same ratio as in the target. Therefore, Zr or Ti need not be contained in the ceramic PZT target in an excess amount.

A 12-inch ceramic PZT target was used in RF magnetron sputtering. The RF magnetron sputtering was carried out for 5 minutes at 1.0 to 1.5 W, using a rotary magnet, maintaining the target at a distance of 60 mm from the substrate and using Ar gas at a pressure of 0.5 to 2.0 Pa. This sputtering yielded an amorphous PZT film having a thickness of 250 to 300 nm.

Prior to this RF magnetron sputtering, pre-sputtering was performed for one hour under the same conditions as the RF magnetron sputtering. One objective of the pre-sputtering is to set specific surface condition and surface temperature of the target. The other objective of the pre-sputtering is to set a specific environment in the sputtering chamber. The conditions of the pre-sputtering greatly influence the Pb content that the PZT film has and the structure and electrical characteristics that the PZT film will have after crystallized.

After the amorphous PZT film has been formed by sputtering, RTA is performed for 5 seconds in an oxygen atmosphere at 650° C. The amorphous PZT film is thereby crystallized.

The PZT film thus crystallized was subjected to XRD. The XRD proved that the PZT film was not a preferred oriented film having a perovskite phase. When the PZT film was observed for its microstructure, PZT grains having a diameter of 0.3 to 0.6 μm were found on the SRO film. Moreover, the PZT film was found to have a sufficiently smooth surface.

Next, an SRO film 16, which will be a part of the upper electrode of the capacitor, is formed on the PZT film 15, to a thickness of 10 to 20 nm. The SRO film 16 is formed in the same way as an SRO film for the lower electrode. First, an amorphous SRO film is formed at room temperature by means of DC magnetron sputtering, in which a ceramic SRO target is used. This sputtering is carried out in an Ar atmosphere at a low power of about 200 to 400 W. RTA is then performed, crystallizing the amorphous SRO film in an oxygen atmosphere at 650° C. for 30 seconds.

Thereafter, a Pt film 17, which will be a part of the upper electrode, is formed on the SRO film 16, in the same conditions as the Pt film for the lower electrode. That is, the Pt film 17 is formed by DC magnetron sputtering, to a thickness of 50 to 200 nm.

Further, to form an upper-electrode pattern of the capacitor, dry etching is carried out in an atmosphere consisting mainly of Ar gas and chlorine-based gas, by the use of an RIE apparatus. More specifically, a positive resist pattern is formed on the Pt film 17, and the Pt film 17 and the SRO film 16 are etched in the order mentioned, by using the positive resist pattern as a mask. Since the SRO film 16 is thin, both the Pt film 17 and the SRO film 16 can be etched with the same etching gas. During the RIE process, that part of Pt which is etched away by the physical etching sticks onto the side walls of the resist pattern, inevitably forming fences. These fences will form dust or will cause short-circuiting after the positive resist pattern is removed. In view of this, the gas pressure in the RIE apparatus should be adjusted to form the Pt electrode having tapered sidewalls, in order to prevent Pt from sticking onto the sidewalls of the resist pattern.

Then, the PZT film 15 is patterned by RIE, using, as a mask, the patterned Pt/SRO film of the upper electrode. Residue may remain on the sidewalls of the PZT film during the etching of the PZT film. If this happens, the residue is removed by, for example, wet etching using diluted hydrochloric acid.

Next, RIE is performed to form the lower electrode and wires, using a mixture of Ar gas and chlorine-based gas. If the SRO film 14 is not used as wires, the etching will be performed on the SRO film by using, as the mask, the patterned layer consisting of the upper electrode and the PZT film. Alternatively, the SRO film 14 will be etched after the PZT film is etched.

The capacitor and the wiring layer are thereby formed. Thereafter, plasma CVD is carried out, thereby forming an Si oxide film, or an interlayer insulating film 20. The interlayer insulating film 20 is subjected to RIE, making a contact hole. A barrier layer 18 made of barrier metal such as TiN is then formed. An Al wire 19 is formed on the barrier layer 18. The Al wire may be formed after filling another contact hole by blanket W-CVD, because a contact to the lower electrode must be formed. Thereafter, the ordinary process is performed to provide wires.

A capacitor of the Pt/SRO/PZT/SRO/Pt/Ti structure was made by a method similar to the method described above. This capacitors had a PZT film having a thickness of 220 nm. In preparing these samples, the unfinished structure was annealed, prior to the forming of the Al wire, at 600 C. for one hour in oxygen, for two objectives. The first objective is to make the unfinished structure to regain the ferroelectric characteristic, which had been deteriorated due to plasma or atmosphere applied in the RIE and forming the insulating film. The second objective is to enhance the bonding between the PZT film and the electrodes. The capacitor samples were examined for their characteristics.

Figure 3A:
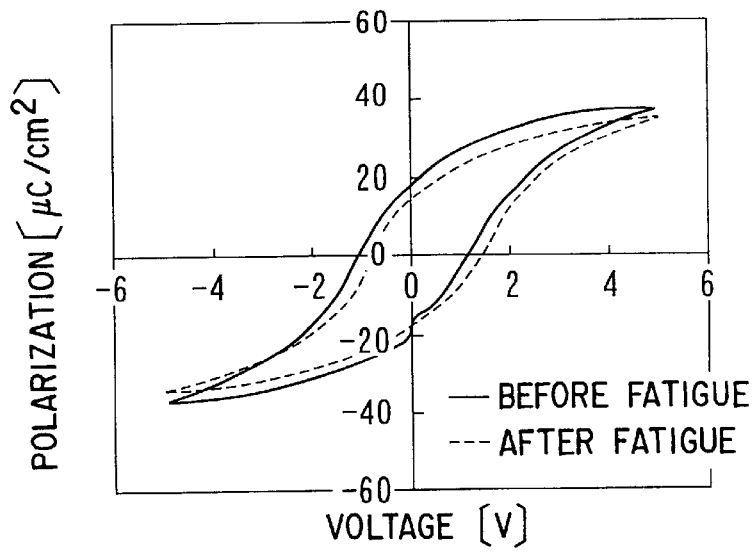
FIG. 3A shows the hysteresis of a capacitor according to the invention exhibited.
Figure 3B:
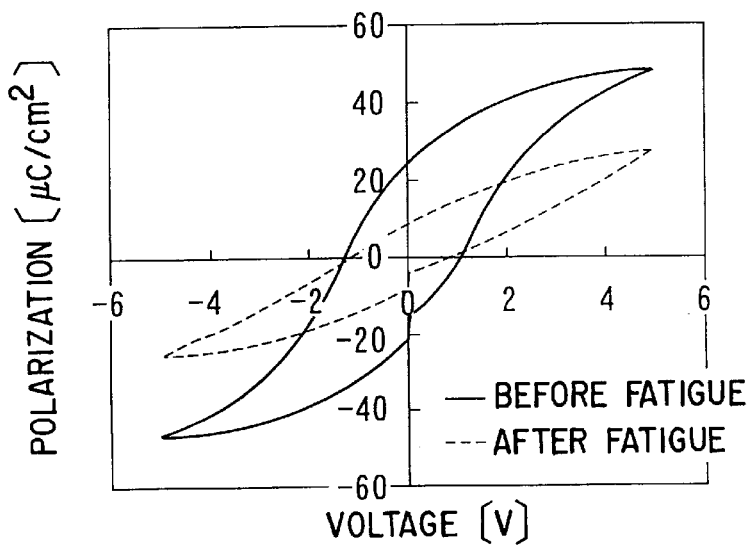
FIG. 3B represents the hysteresis of a capacitor, which falls outside the scope of the present invention.

The hysteresis characteristics of the capacitor is shown in FIG. 3A. FIG. 3B shows, for purpose of comparison, the hysteresis of a capacitor of the Pt/PZT/Pt/Ti structure having no SRO films, which therefore falls outside the scope of the invention. The capacitor according to the invention underwent polarization 2Pr (remanent polarization+2) was about 40 $\mu C/cm^2$. Both the polarization and the coercive field were almost uniform over the entire Si wafer. The coercive voltage was low, about 1 V. Even when the sputtering conditions (sputtering power, gas pressure, and the like) were changed, the PZT film of the capacitor excelled in saturation characteristic, polarization, and coercive field. In addition, the PZT film was good in terms of characteristic reproducibility, too. The capacitor of the invention was tested for their fatigue characteristics, and their characteristics was not much deteriorated from the initial value.

Figure 4:
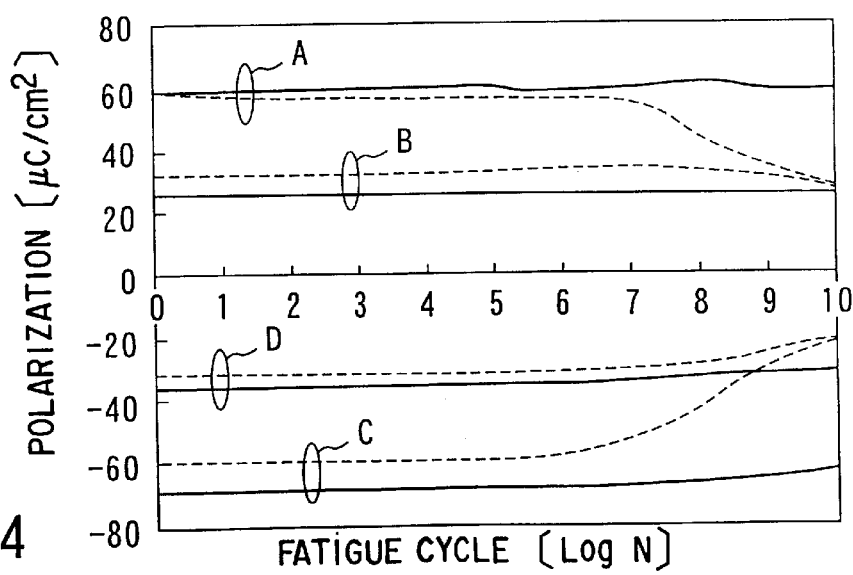
FIG. 4 is a graph illustrating the fatigue characteristic of the capacitor according to the invention, and that of the capacitor falling outside the scope of this invention.

In FIG. 4, the solid lines indicate the fatigue characteristic of the capacitor according to the invention, and the broken lines represent the fatigue characteristic of the comparative capacitor (Pt/PZT/Pt) that had no SRO films. The fatigue characteristics of both capacitors were evaluated by applying a voltage of 3 V to the capacitors. In FIG. 4, lines A indicate the fatigue characteristics the capacitors exhibited when the voltage was applied in the positive direction after the writing had been performed in the negative direction. Lines B depict the fatigue characteristics the capacitors exhibited when the voltage was applied in the positive direction after the writing had been performed in the positive direction. Lines C illustrate the fatigue characteristics the capacitors exhibited when the voltage was applied in the negative direction after the writing had been performed in the positive direction. Lines D show the fatigue characteristics the capacitors exhibited when the voltage was applied in the negative direction after the writing had been performed in the negative direction. In the capacitor according to the invention, the polarization scarcely changed in degree until the writing operation was repeated $10^{10}$ times.

Figure 5A:
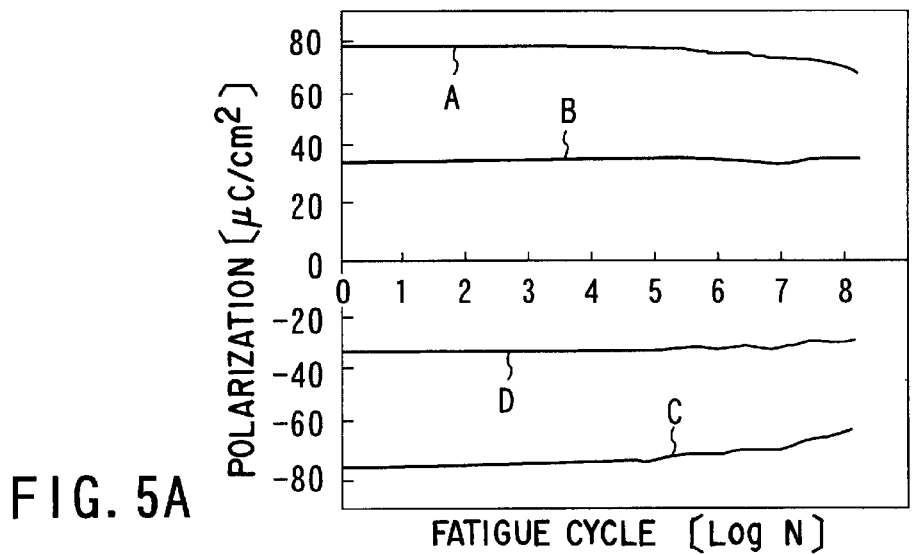
FIGS. 5A and 5B are graphs illustrating how the fatigue characteristic of the capacitor according to the invention depends upon the thickness of the SRO film of the capacitor.
Figure 5B:
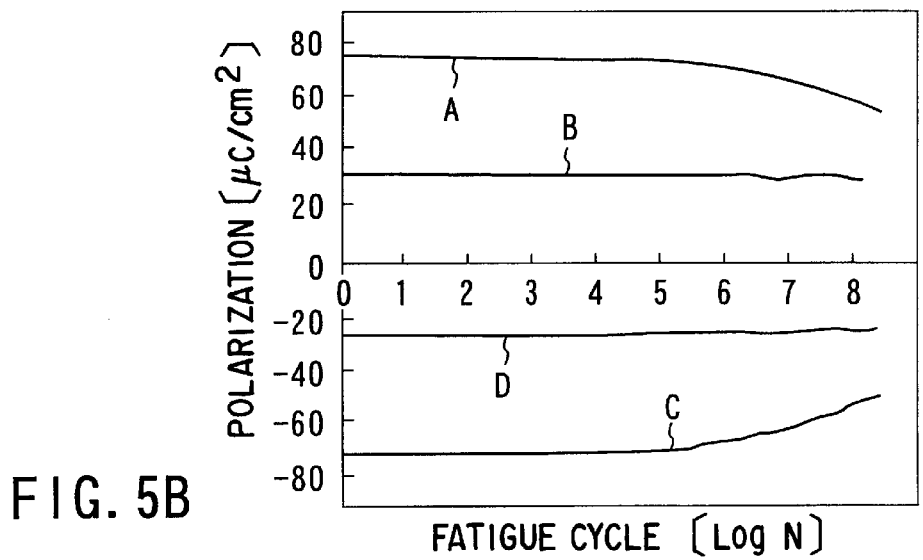

Two types of capacitors were made, wherein only the upper electrode had an SRO film. The PZT films of the capacitors of both types had a thickness of 150 nm. The SRO film of the capacitor of the first type was 20 nm, while the SRO film of the capacitor of the second type was 2.5 nm thick. A voltage of 3 V was repeatedly applied to the capacitors of both types to see how the fatigue characteristic depends on the thickness of the SRO film. FIGS. 5A and 5B show the results of the test on the first type capacitor and the second type capacitor, respectively. As seen from FIG. 5A, the polarization was deteriorated only a little in the capacitor of the first type. As FIG. 5B indicates, the polarization was much deteriorated in the capacitor of the second type at $10^8$ cycles or more.

The following may be the reason why the fatigue characteristic is deteriorated if the SRO film is thin (2.5 rim or less). If the SRO film is too thin, it will be no longer continuous, forming islands. In other words, the SRO film cannot cover the entire PZT film or the Pt film. Consequently, the PZT film and the Pt film contact at the parts not covered with the SRO film. This deteriorates the fatigue characteristic of the capacitor.

Figure 6:
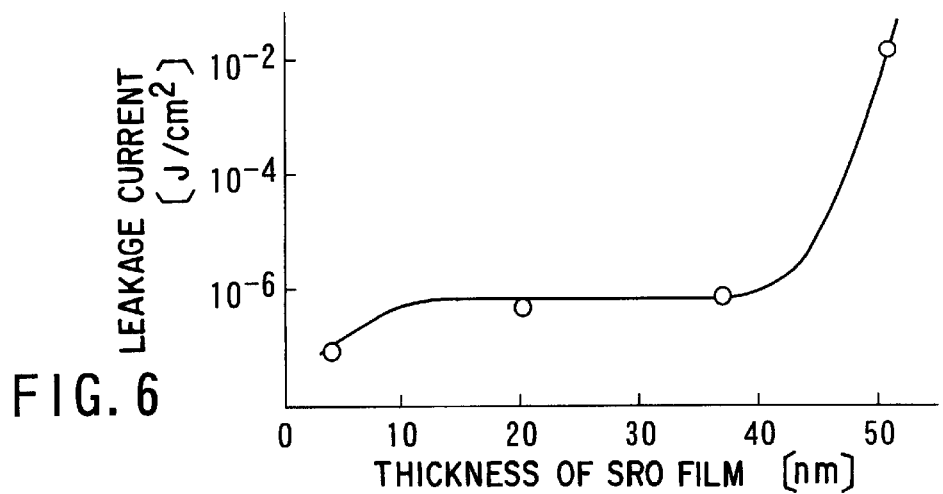
FIG. 6 is a diagram representing how the leakage current in the capacitor according to the invention depends on the thickness of the SRO film used in the capacitor.

Moreover, capacitors were made, each having an SRO film of a different thickness. These capacitors were tested to demonstrate how the leakage current depends on the thickness of the SRO film. First, polarization was induced in each capacitor. Then, the current flowing through each capacitor was measured as the voltage applied to the capacitor in the polarization direction was varied stepwise. FIG. 6 shows the results of this test. As seen from FIG. 6, the leakage current was small in the capacitors with an SRO film having a thickness of less than 40 nm. By contrast, the leak current was far larger in the capacitors with an SRO film having a thickness of 40 nm or more.

Thus, the thicker the SRO film, the far larger the leakage current. The reason may be as follows. As the amorphous PZT film is crystallized, the excessive Pb is extracted to the grain boundaries. The excessive Pb reacts with the residues (Ru, RuO, SrO, or the like), when the amorphous SRO film is crystallized, forming a compound of Pb, Ru and O. This compound is electrically conductive. If the compound is formed in the PZT film, a leakage current will be generated. As long as the SRO film is thin, it contains Ru, $RuO_2$ or the like, but in a small amount. If the SRO film is thick, however, it contains Ru, $RuO_2$ or the like in a large amount, forming the electrically conductive compound in a large amount. This inevitably increases the leakage current.

In view of the above, it is desired that the SRO film be thicker than 2.5 nm and thinner than 40 nm. More preferably, the SRO film should be thicker than 10 nm and thinner than 20 nm, for the following reason.

Hillocks may be formed on the lower electrode when the amorphous SRO film on the Pt film (i.e., lower electrode) is heated to be crystallized. If the SRO film is 10 nm or less thick, the hillock will destroy the structure of the capacitor. Further, if the SRO film is 10 nm or less thick, it will be not uniform in structure (e.g., thickness and surface roughness) after the amorphous PZT film is crystallized. Hence, it is desirable that the SRO film be thicker than 10 nm.

If the SRO film is 20 nm or more thick, however, the residues (Ru, RuO, SrO, or the like) will greatly increase in amount. If the SRO film is only about 20 nm, almost no increase in the leakage current is observed during the film forming process. During the heat treatment (at 650° C. for one hour in an oxygen atmosphere) in the integration process, however, the leakage current may increase very much. Thus, it is desired that the SRO film be thinner than 20 nm.

As indicated above, the fatigue characteristic, anti-reduction characteristic and barrier characteristic of the capacitor can be enhanced by providing SRO films on the PZT films of the lower and upper electrodes. Further, since the SRO films have a thickness within the prescribed range, it is possible to minimized the leakage current. In addition, since the SRO films are relatively thin, their crystallinity can be improved, thereby to enhance the anti-reduction characteristic of the capacitor.

The SRO films may be replaced by $(La, Sr)CoO_3$ films or the like, a superconductive film such as $YBa_2Cu_3O7$ (YBCO) or the like, or a noble metal oxide film such as $IrO_2$, $RuO_2$ or the like. In this case, too, the capacitor can be improved in fatigue characteristic and in the crystallinity of the films. It can be expected that YBCO, $IrO_2$, $RuO_2$ may reduce the leakage current.

SECOND EMBODIMENT

Figure 2:
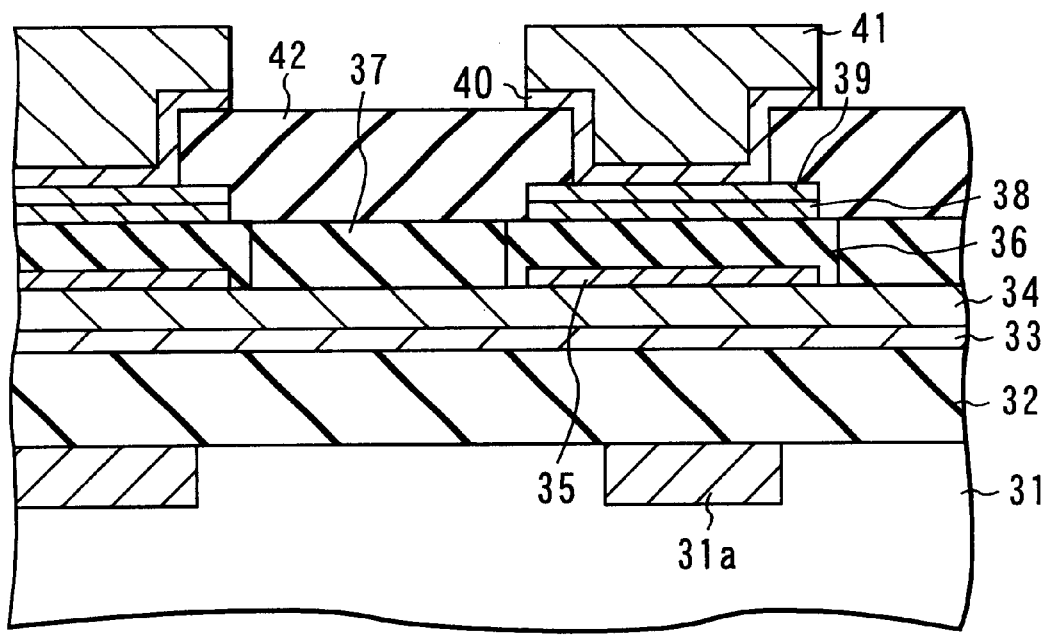
FIG. 2 is a sectional view illustrating mainly the capacitor region of a semiconductor device according to the second embodiment of the present invention.

FIG. 2 is a sectional view illustrating the capacitor region of a semiconductor device that is the second embodiment of this invention. Like the first embodiment, the second embodiment is a ferroelectric memory which comprises capacitors, each having, as dielectric film, a PZT film that is made of perovskite oxide.

The method of manufacturing the structure shown in FIG. 2 will be explained below.

First, a transistor 31a or the like is formed in the surface of an Si substrate 31 by the ordinary process. A CMOS structure is thereby provided. An Si oxide film, or an interlayer insulating film 32, is then formed by a CVD method.

Next, a Ti adhesion layer 33 is formed on the Si oxide film 32. Further, a TiN film 34 (150 nm thick) is formed on the Ti adhesion layer 33 by means of DC magnetron sputtering. The layer consisting of the Ti adhesion layer 33 and TiN film 34 will be a wiring layer (plate line), which is a part of the lower electrode of a capacitor.

Then, an SRO film 35 about 10 to 20 nm thick is formed. First, an amorphous SRO film is formed at room temperature by DC magnetron sputtering, to a thickness of about 10 to 20 nm. The target used in the sputtering has the same composition of the SRO film formed. More precisely, the amorphous SRO film is formed in an Ar atmosphere at a low power of about 200 to 400 W. If the amorphous SRO film is formed by reactive sputtering using oxygen, it will have a decreased uniformity in thickness and composition in the entire wafer. In view of this, the amorphous SRO film should better be formed in an atmosphere consisting of Ar only.

If an amorphous PZT film is formed and crystallized while the SRO film remains amorphous, mutual diffusion will occur at the interface between the SRO film and the PZT film, inevitably deteriorating the characteristics of the capacitor. To prevent the mutual diffusion, RTA is carried out in an oxygen atmosphere at 650° C. for 30 seconds, thereby crystallizing the amorphous SRO film provided on the Pt film. If the amorphous SRO film contains Ru in an amount 2 to 3% greater than the ordinary amount, the crystallization will be promoted.

The SRO film 35 is patterned, only at its capacitor region. Further, the TiN/Ti composite layer is patterned, forming a wiring layer (plate line).

An amorphous PZT film is formed on the SRO/TiN electrode by means of RF magnetron sputtering. The target used in the RF magnetron sputtering is a ceramic PZT target that contains Pb in an amount about 10% larger than the ordinary value, as in the first embodiment. This target has the same composition as the target used in the first embodiment. The conditions of sputtering are the same as in the first embodiment, too. The amorphous PZT film, thus formed, has a thickness of 250 to 300 nm.

The amorphous PZT film is heated in an oxygen atmosphere at 650 C. for 5 seconds by means of RTA, thereby crystallizing the amorphous PZT film. The PZT film thus crystallized was subjected to XRD for its crystal structure. The XRD proved that the PZT film was not a preferred oriented film having a perovskite phase. When the PZT film was observed for its microstructure, PZT grains having a diameter of 0.3 to 0.6 $\mu$m were found on the SRO film. Moreover, the PZT film was found to have a sufficiently smooth surface. A PZT film 37, which lies on the TiN film 34, was examined by XRD for its crystal structure. The part 37 was not a crystal structure having a perovskite phase, but was an amorphous structure or a structure having a pyrochlore phase.

It should be noted that a pyrochlore phase is represented by a general formula of $A_2B_2O_7$. The pyrochlore phase in a PZT film is represented by a formula of $Pb_2(Zr, Ti)_2O_7$. The pyrochlore phase is formed, particularly at low temperatures, when the amorphous or compound material is crystallized, and does not exhibit ferroelectricity.

Next, a SRO film 38, which will be a part of the upper electrode, is formed to a thickness of 10 to 20 nm, on the PZT films 36 and 37, in the same method as the SRO film of the lower electrode. First, an amorphous SRO film is formed at room temperature by DC magnetron sputtering, by using a ceramic SRO target. The amorphous SRO film is crystallized by means of RTA, in an oxygen atmosphere at 650° C. for 30 seconds.

Further, a TiN film 39, which will be a part of the upper electrode, is formed on the SRO film 38 by DC sputtering. A positive resist pattern for forming the upper electrode is formed on the TiN/SRO composite layer. Using the positive resist pattern as a mask, the TiN film 39 and SRO film 38 are etched. This etching is performed in an atmosphere consisting mainly of Ar gas and chlorine-based gas, by mans of an RIE apparatus. As a result, an upper-electrode TiN/SRO pattern is formed.

Thus formed is a capacitor structure. In the present embodiment, the PZT film 37 provided between the adjacent capacitors has an amorphous structure or a pyrochlore structure. The film 37 therefore has a smaller dielectric constant than a PZT film of perovskite structure. The film 37 reduces the parasitic capacitance, e.g., a capacitance between wires, and can ultimately minimizes crosstalk noise.

After the capacitor structure is formed, a silicon oxide film, or an interlayer insulating film 42, will be formed. Dry etching is performed on the interlayer insulting film 42, thereby making a contact hole in the film 42. A barrier metal layer 40 and an Al wire 41 are formed, thus providing the structure illustrated in FIG. 2.

A capacitor of TiN/SRO/PZT/SRO/TiN/Ti structure was manufactured by the same method as described above. The capacitor was tested for its characteristics, in the same manner as the first embodiment. The capacitor was excellent in both hysteresis characteristic and fatigue characteristic, like the capacitor of the first embodiment. When a rectangular wave for driving the ferroelectric memory and having pulse width of 100 nsec was applied to the structure, neither the leading edge nor trailing edge of the wave deformed or delayed. Hence, the electrode structure was one that can fully function as a plate line.

THIRD EMBODIMENT

Figure 7:
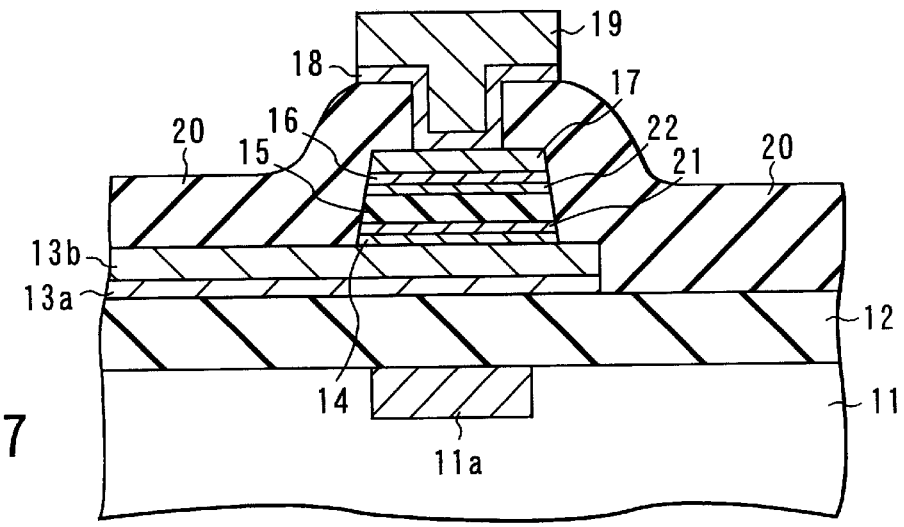
FIG. 7 is a sectional view showing mainly the capacitor region of a semiconductor device according to the third embodiment of the invention.

FIG. 7 is a sectional view showing the capacitor region of a semiconductor device according to the third embodiment of the invention. Like the first embodiment, the third embodiment is a ferroelectric memory which comprises capacitors, each having, as dielectric film, a PZT film that is made of perovskite oxide. Basic structure and manufacturing process of the third embodiment are similar to those of the first embodiment.

In the third embodiment, an amorphous SRO film is crystallized, forming an SRO film 14 as in the first embodiment. Then, a thin Ti film (about 1 to 5 nm thick) is formed on the SRO film by means of sputtering. Thereafter, a PZT film 15 is formed. When the amorphous PZT film 15 is heated and thereby crystallized, a Ti-rich layer 21 (composed mainly of PbTiO$_3$) is formed at the interface between the SRO film 14 and the PZT film 15.

Further, after the amorphous PZT film is crystallized as in the first embodiment, a thin Ti film (about 1 to 5 nm thick) is formed on the PZT film 15 by sputtering. Then, an SRO film 16 is formed. When the SRO film 16 is heated and crystallized, a Ti-rich layer 22 (composed mainly of PbTiO$_3$) is formed at the interface between the SRO film 16 and the PZT film 15.

Figure 8:
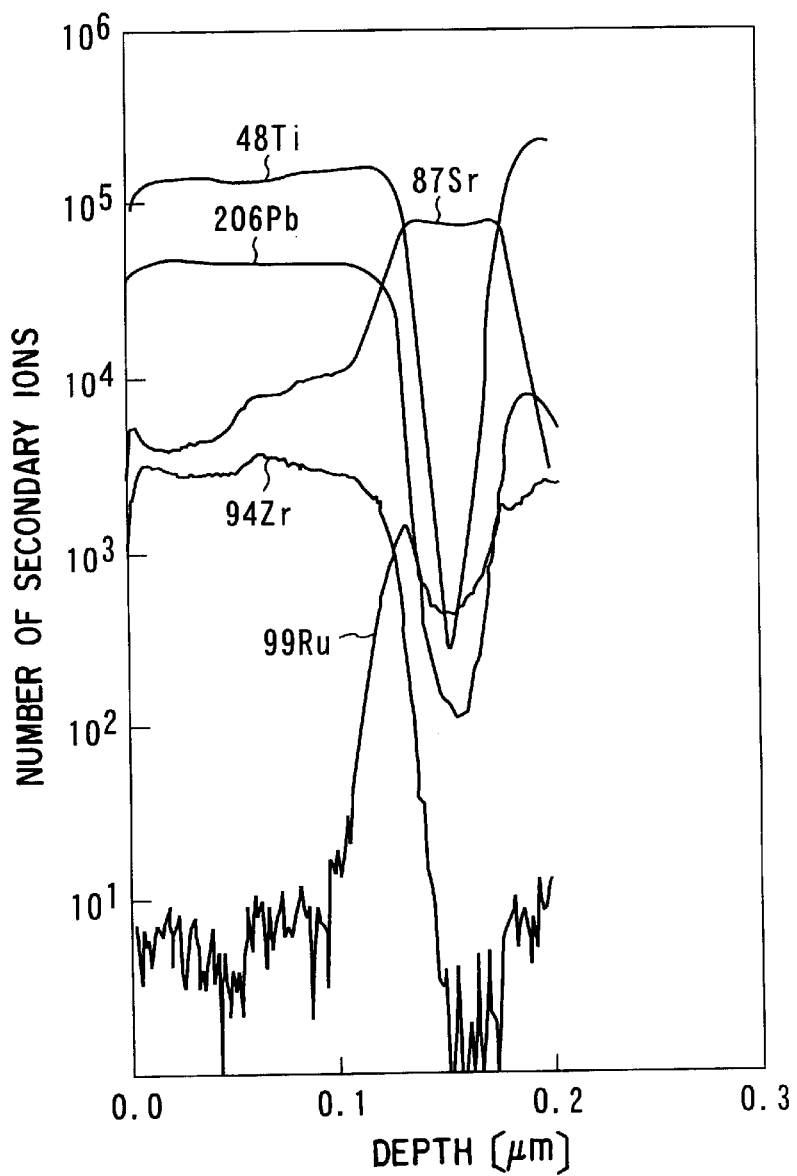
FIG. 8 is a graph representing the concentration profiles of various elements in the capacitor having Ti layer, to demonstrate the advantage of the third embodiment.
Figure 9:
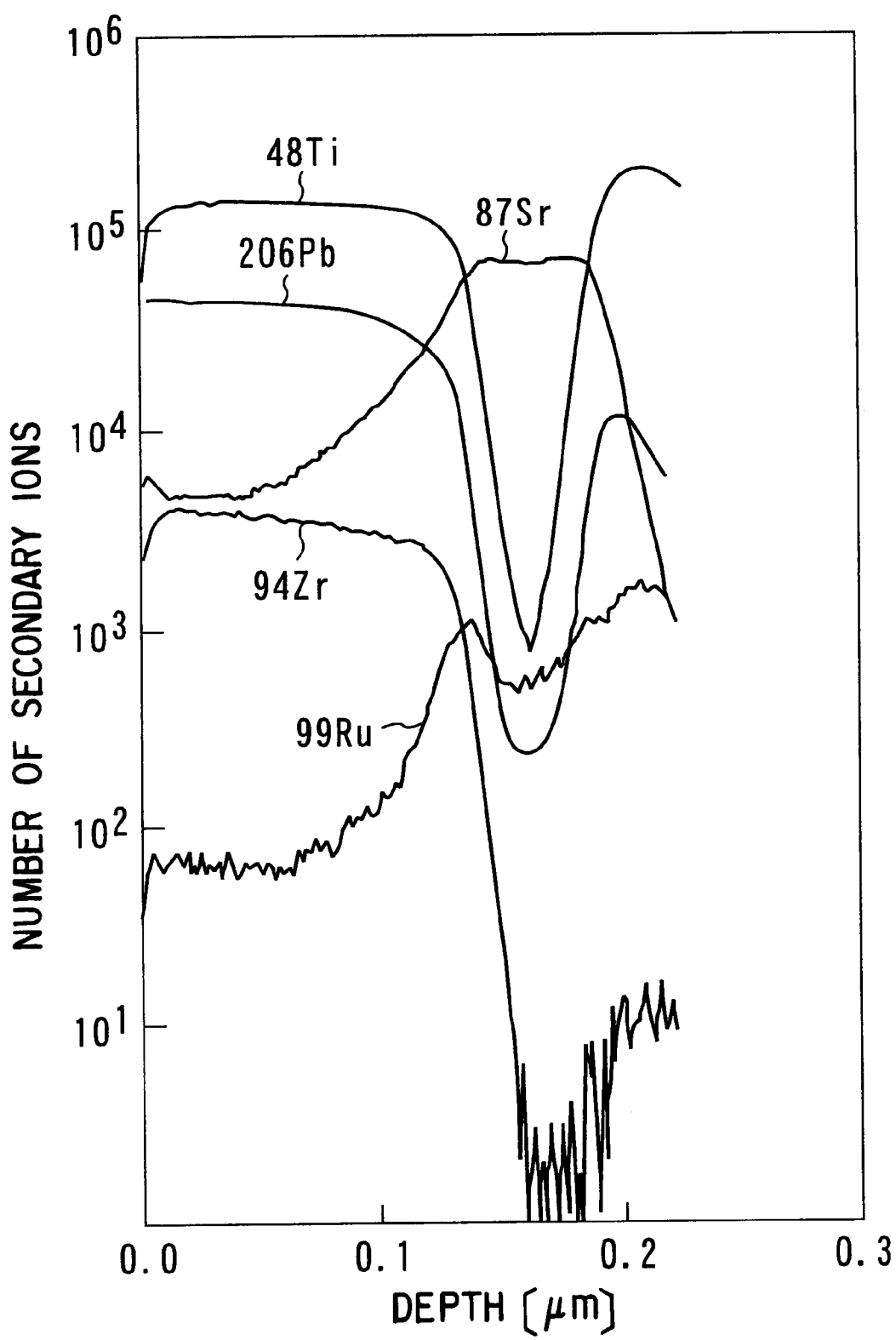
FIG. 9 is a graph representing the concentration profiles of various elements in a comparative capacitor having no Ti layer.

FIG. 8 represents the concentration profiles of various elements, obtained by the use of a SIMS, to demonstrate the advantage achieved by a Ti-rich layer. FIG. 9 shows the concentration profiles of the element in a comparative sample that had no Ti-rich layers. In the samples subjected to the SIMS observation comprise an Si substrate and a composite layer formed on the Si substrate and composed of a PZT film (150 nm thick), an SRO film (50 nm thick) and a Pt film (175 nm thick). The thickness of the SRO film was set at 50 nm in order to observe the SIMS profile more precisely at the interface between the PZT film and the SRO film. In the sample, wherein the elements had the concentration profiles shown in FIG. 8, a Ti layer having a thickness of 2 nm is provided on the SRO film and an amorphous PZT film is provided on the Ti layer. In the sample, wherein the elements had the concentration profiles shown in FIG. 9, a PZT film is provided directly on the SRO film. In both samples, the PZT film was heated 700° C. and crystallized. Neither the concentration profile Si nor that of Pt are illustrated in FIGS. 8 and 9.

As the comparison of FIGS. 8 and 9 may show, the sample having a Ti-rich layer is advantageous over the sample having no Ti-rich layers in the following respects.

First, no reduction in the amount of Ti was observed in the vicinity of the interface between the PZT film and the SRO film. In other words, the Ti concentration near the interface was higher than in the PZT film (bulk). Second, the reduction in the amount of Pb was small in the vicinity of the interface between the PZT film and the SRO film. Third, the Ru diffused only a little from the SRO film into the PZT film.

These advantages seem to have resulted from the fact the Ti layer reacted with Pb, forming a PbTiO$_3$ (or PZT) layer. More specifically, Ti reacted with an excess of Pb, inhibiting the diffusion of Pb. Further, the PbTiO$_3$ layer also served to inhibit the diffusion of Ru.

Thus, a Ti layer was formed between the PZT film and the SRO film, and a PbTiO$_3$ layer or the like was formed, inhibiting the diffusion of Pb and Ru. Since neither Pb nor Ru did diffuse, the forming of an electrically conductive compound made of Pb, Ru and 0 was inhibited. As a result, it was possible to reduce the leakage current in the PZT film.

It is advisable to form a SrTiO$_3$ (STO) layer on the SRO film before the PZT film is formed. The STO layer may be formed on the SRO film by various methods. In one method, a thin Ti layer is formed on the amorphous SRO film and the surface region of the SRO film is changed to the STO layer as the SRO film is crystallized. In another method, a Ti layer is formed on a crystallized SRO film and thermally processed, changing the surface region of the SRO film to the STO layer. The STO layer, thus formed on the surface of the SRO film, can provide the following advantages.

First, the perovskite structure at the surface of the SRO film can be improved in crystallinity, because STO is crystallized at lower temperatures. This can enhance the crystallinity of the PZT film provided on the SRO film and the coordination of the PZT film and electrode at the interface between them. Second, the mutual diffusion and reaction of Pb and a substance (Ru, RuO$_2$, SrO, or the like) formed when the SRO film is crystallized can be suppressed. Third, the STO layer functions as a barrier, inhibiting the decomposition of the SRO film in the reducing atmosphere.

In the present embodiment, a Ti layer is formed between the SRO film and the PZT film. Ti can be replaced by another element, as will be described below.

First, a B-site element of a perovskite dielectric material represented by general formula $ABO_3$ (for example, PZT, where A is Pb, B is Zr and Ti) can be used in place of Ti.

Second, a B-site element of a dielectric material represented by general formula $Bi_2A_{x-1}B_xO_{3x+3}$ (for example, $SBT(SrBi_2Ta_2O_9)$ can be used in place of Ti. The dielectric material, represented by this general formula, comprises $Bi_2O_2$ layers and at least one pseudo perovskite structure layer interposed between the $Bi_2O_2$ layers. The B-site element of this crystal structure corresponds to the B-site element of the perovskite structure. Known as ferroelectric materials having this crystal structure are, besides SBT, $Bi_2SrTa_2O_9$, $Bi_2Sr(Ta, Nb)_2O_9$, $Bi_4Ti_3O_{12}$, $Bi_2PbNb_2O_9$, $Bi_4BaTi_4O_{15}$, $Bi_4SrTi_4O_{15}$.

Specific examples of B-site elements in the dielectric materials represented by formulas $ABO_3$ and $Bi_2A_{x-1}B_xO_{3x+3}$ are Ti, Nb, Ta, W, Co, Zr, Mn, Fe and Ni.

An extremely thin Pt layer may be formed between the SRO film and the PZT film, thereby to attain advantages similar to those mentioned above.

The present invention is not limited to the embodiments that have been described. Various changes and modifications can be made.

In each of the embodiments described above, the upper and lower electrodes of the capacitor are composite layers, each consisting of an SRO film and a low-resistance film (Pt film or TiN film). Nonetheless, only the upper electrode or the lower electrode may be a composite layer consisting of an SRO film and a low-resistance film, in accordance with the characteristic that are required of the capacitor. If the reduction of PZT in the reducing atmosphere makes a problem, for example, it is desired that the upper electrode be a composite layer consisting of an SRO film and a low-resistance film. If the diffusion of metal from the lower electrode makes a problem, it is desired that the lower electrode be a composite layer consisting of an SRO film and a low-resistance film.

Besides Pt and Ti, low-resistance metals such as W, Ir, Ru, Mo and the like can be used as materials of the upper and lower electrodes. Alternatively, compounds of these metals may be used as materials of the upper and lower electrodes. Further, silicide such as $WSi_2$ may be used as such.

In the embodiments described above, sputtering is performed to form an amorphous SRO film and an amorphous PZT film. Other methods, such as sol-gel method, MOD method, laser abrasion, evaporating method, thermal CVD, MOCVD, and the like may be employed to form an amorphous SRO film and an amorphous PZT film.

In the embodiment described above, the amorphous SRO and the amorphous PZT film are heat-treated and crystallized. Instead, an SRO film and a PZT film, both already crystallized, may be deposited.

In the embodiments described above, PZT is used as the material of the dielectric film made of oxide. The material is not limited to PZT. Any dielectric material having a perovskite structure represented by formula $ABO_3$ can be used. Furthermore, any dielectric material represented by formula $Bi_2A_{x-1}B_xO_{3x+3}$ can also be used instead. In these materials, at least one element selected from the group consisting of Pb, Ba, Sr, Ca, and La can be used as the A-site element, and at least one element selected from the group consisting of Ti, Zr, Nb, Ta, Fe, W, Co, and Ni can be used as the B-site element.

As has been described, the capacitor according to this invention has electrodes made of a composite layer that consists of an SRO film and another electrically conductive film. Therefore, the electrodes have not only a low resistance and improved fatigue characteristic, but also enhanced anti-reduction property and barrier property. In addition, the leakage current in the capacitor can be decreased. The change or deterioration of characteristics can be inhibited in the capacitor according to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate; and a capacitor provided above the semiconductor substrate and having an upper electrode, a lower electrode and a dielectric film provided between the upper electrode and the lower electrode;

wherein at least one of the electrodes comprises an $SrRuO_3$ film provided near the dielectric film and a conductive film made of conductive material other than $SrRuO_3$ provided away from the dielectric film;

said dielectric film is made of a dielectric material of perovskite structure represented by formula $ABO_3$, where A is at least one A-site element, B is at least one B-site element, and O is oxygen, or a dielectric material represented by formula $Bi_2A_{x-1}B_xO_{3x+3}$, where A is at least one A-site element, B is at least one B-site element, Bi is bismuth, O is oxygen, and x is greater than 1; and wherein the dielectric film is provided on a different region of the $SrRuO_3$ film and an additional dielectric film is provided on a different region of the $SrRuO_3$ film, and located near the dielectric film, and made of the same material as the dielectric film and is different in crystal structure from the dielectric film.

2. A semiconductor device according to claim 1, wherein the dielectric film is a $Pb(Zr_yTi_{1-y})O_3$ film, wherein y is greater than 0 and less than 1.

3. A semiconductor device comprising:

a semiconductor substrate; and a capacitor provided above the semiconductor substrate and having an upper electrode, a lower electrode and a dielectric film provided between the upper electrode and the lower electrode;

wherein at least one of the electrodes comprises an $SrRuO_3$ film provided near the dielectric film and a conductive film made of conductive material other than the $SrRuO_3$ provided away from the dielectric film;

said dielectric film is made of a dielectric material of perovskite structure represented by formulate $ABO_3$, where A is at least one A-site element, B is at least one B-site element, and O is oxygen, or a dielectric material represented by formula $Bi_2A_{x-1}B_xO_{3x+3}$, where is at least a A-site element, B is at least one B-site element, Bi is bismuth, O is oxygen, and x is greater than 1; and wherein a concentration of a B-site element near an interface between said dielectric film and the $SrRuO_3$ film is higher than in the dielectric film.

4. A semiconductor device according to claim 3, further comprising a transistor provided in the semiconductor substrate, and an inter layer insulating film provided between the capacitor and the semiconductor substrate in which the transistor is provided.

5. A semiconductor device according to claim 4, wherein the conductive film serves as a plate line.

6. A semiconductor device according to claim 4, wherein the conductive film is a composite layer made of a Pt film and a Ti film.

7. A semiconductor device according to claim 4, further comprising a barrier layer provided on the upper electrode and a wiring layer provided on the barrier layer.

8. A semiconductor device according to claim 7, wherein the conductive film serves as a plate line and is a composite layer made of a Pt film and a Ti film.

9. A semiconductor device according to claim 3, wherein the A-site element is selected from the group consisting of Pb, Ba, Sr, Ca and La, and the B-site element is selected from the group consisting of Ti, Zr, Nb, Ta, Fe, W, Co and Ni.

10. A semiconductor device according to claim 3, wherein the dielectric film is one selected from the group consisting of a $Pb(Zr_yTi_{1-y})O_3$ film, where y is greater than 0 and less than 1, and an $SrBi_2Ta_2O_9$ film.

11. A semiconductor device according to claim 3, wherein the conductive film contains a metal selected from the group consisting of Pt, Ti, W, Ir, Ru and Mo.

12. A semiconductor device comprising:

a semiconductor substrate; and a capacitor provided above the semiconductor substrate and having an upper electrode, a lower electrode and a dielectric film provided between the upper electrode and the lower electrode;

wherein at least one of the electrodes comprises an $SrRuO_3$ film provided near the dielectric film and a conductive film made of conductive material other than $SrRuO_3$ provided away from the dielectric film;

said dielectric film is made of dielectric material of perovskite structure represented by formulate $ABO_3$, where A is at least one A-site element, B is at least one B-site element, and O is oxygen, or a dielectric material represented by formulate $Bi_2A_{x-1}B_xO_{3x+3}$, where is at least one A-site element, B is at least one B-site element, Bi is bismuth, O is oxygen, and x is greater than 1; and wherein a concentration of the B-site element of said dielectric film is higher at an interface between the dielectric film and the $SrRu\ O_3$ film than at a middle portion of the dielectric film.

* * * * *

UNITED STATES PATENT AND TRADEMARK OFFICE
CERTIFICATE OF CORRECTION

PATENT NO. : 6,351,006 B1
DATED : February 26, 2002
INVENTOR(S) : Yamakawa et al.

It is certified that error appears in the above-identified patent and that said Letters Patent is hereby corrected as shown below:

Column 14,
Line 36, delete "different".
Lines 38-39, change "on a different region of the $SrRuO_3$ film, and located near" to -- adjacent --.
Line 37, change "film and" to -- film, and --.
Line 55, change "the $SrRuO_3$" to -- $SrRuO_3$ --.
Line 57, change "formulate" to -- formula --.
Line 60, change "where is" to -- where A is --.
Line 61, change "least a" to -- least one --.
Line 63, change "of a" to -- of the --.
Line 63, change "element near" to -- element in a region near --.
Line 65, change "in" to -- that of --.

Column 16,
Line 12, change "of dielectric" to -- of a dielectric --.
Line 13, change "formulate" to -- formula --.
Line 16, change "formulate" to -- formula --.
Line 16, change "where is" to -- where A is --.

Signed and Sealed this

Twenty-fifth Day of February, 2003

JAMES E. ROGAN
*Director of the United States Patent and Trademark Office*